United States Patent [19]

Yoshikawa

[11] Patent Number: 4,881,108

[45] Date of Patent: Nov. 14, 1989

[54] SEMICONDUCTOR DEVICE

[75] Inventor: Kuniyoshi Yoshikawa, Tokyo, Japan

[73] Assignee: Kabushiki Kaisha Toshiba, Kawasaki, Japan

[21] Appl. No.: 172,495

[22] Filed: Mar. 24, 1988

[30] Foreign Application Priority Data

Mar. 26, 1987 [JP] Japan .................................. 62-72174

[51] Int. Cl.⁴ ...................... H01L 29/78; H01L 29/34
[52] U.S. Cl. .................................. 357/23.5; 357/23.1; 357/54
[58] Field of Search ........................................ 357/23.5

[56] References Cited

U.S. PATENT DOCUMENTS 4,527,259  7/1985  Watanabe ........................... 357/23.5
4,754,320  6/1988  Mizutani et al. .................... 357/23.5

FOREIGN PATENT DOCUMENTS 097866  5/1986  Japan .................................. 357/23.5

OTHER PUBLICATIONS

Chen, P. C. "Threshold-Alterable Si-Gate MOS Devices", IEEE Transactions on Electron Devices, vol. ED-24, No. 5, May 1977, pp. 584-586.
Chan et al., "A True Single-Transistor Oxide-Nitride-Oxide EEPROM Deivce," IEEE Electron Device Letters, vol. EDL-8, No. 3, Mar. 1987, pp. 93-95.

Primary Examiner—Rolf Hille
Assistant Examiner—Robert P. Limanek
Attorney, Agent, or Firm—Foley & Lardner, Schwartz, Jeffery, Schwaab, Mack, Blumenthal & Evans

[57] ABSTRACT

A semiconductor device includes source and drain regions, a charge accumulation region, and a control gate in a channel region between the source and drain regions. The charge accumulation region is located on the side surface of the control gate.

3 Claims, 2 Drawing Sheets

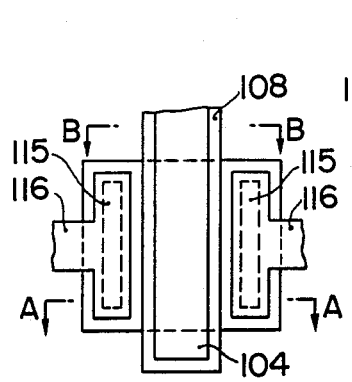 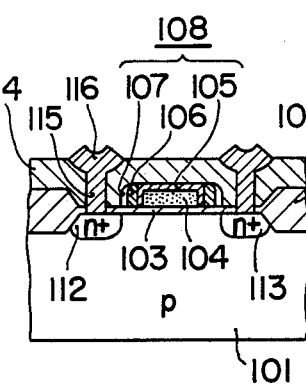 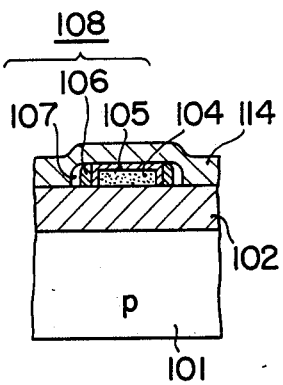
FIG. 1(a)  FIG. 1(b)  FIG. 1(c)
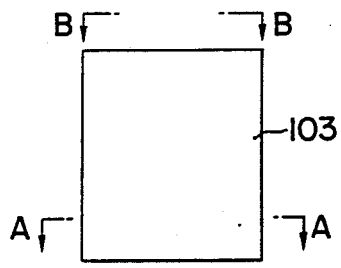 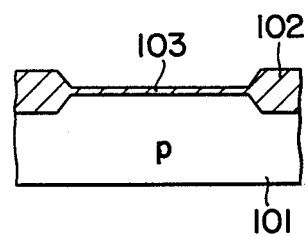 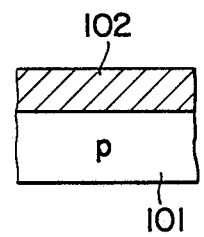
FIG. 2(a)  FIG. 2(b)  FIG. 2(c)
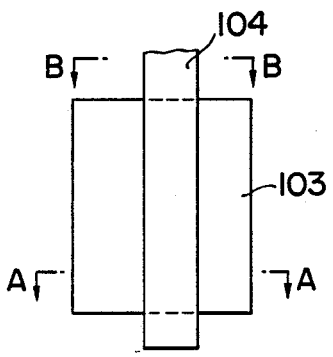 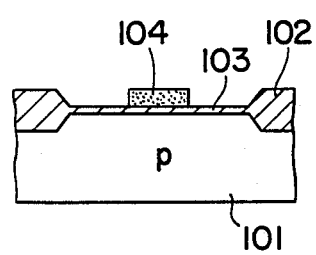 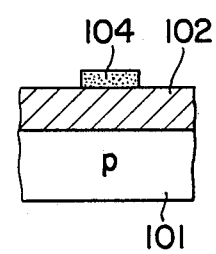
FIG. 3(a)  FIG. 3(b)  FIG. 3(c)

SEMICONDUCTOR DEVICE

BACKGROUND OF THE INVENTION

This invention relates to a semiconductor device and a method of the manufacturing the same, and more particularly to a semiconductor device provided with memory cells of EEPROM (Electrically Erasable Programmable Read Only Memory) type having a charge accumulation region and a control gate and a method of manufacturing such a semiconductor device.

Conventional EEPROMs are considerably complicated in the fabrication process and are difficult to realize in high integration.

SUMMARY OF THE INVENTION

This invention provides a semiconductor device, e.g., an EEPROM etc. of the structure suitable for miniaturization of a device and a method capable of manufacturing such a semiconductor device with a considerably simplified process.

The first invention of this patent application resides in a semiconductor device comprising first and second regions separately provided from each other on a surface region of a semiconductor substrate and serving as source and drain regions, respectively, and a charge accumulation region and a control gate provided on a channel region between these first and second regions through an insulating film, the charge accumulation region being disposed on the channel region on the side surface of the control gate.

The second invention of this patent application resides in a method of manufacturing a semiconductor device, comprising the steps of forming a control gate disposed on a portion of the surface of a semiconductor substrate through an insulating film, forming a first insulating film around the control gate, coating the first insulating film with a second insulating film serving as an accumulation region, coating the second insulating film with a third insulating film, removing successively the three kinds of insulating films using an anisotropic etching method or an ordinary etching method to form the charge accumulation region with the three kinds of insulating films being left on the entirety or a portion of the side surface of the control gate, and doping first and second impurities into the surface of the semiconductor substrate with the three kinds of insulating films or the control gate as a mask at any time before and after the formation of the three kinds of insulating films, thus to form first and second regions serving as source and drain regions, respectively.

In accordance with this invention, the charge accumulation region is formed on the side surface of the control gate. Namely, the charge accumulation region is not formed separately from the transistor as in the prior art, but rather is formed within the transistor. Accordingly, one transistor/one cell structure is provided, so that a semiconductor device, e.g., an EEPROM, etc. suitable for miniaturization is realized.

In addition, since the gate electrode is of a structure comprising only one layer as a result of the fact that the charge accumulation layer is provided on the side surface of the control gate, the manufacturing process is much more simple.

BRIEF DESCRIPTION OF THE DRAWINGS

In the accompanying drawings:

FIG. 1 is a view showing the configuration of a memory cell of an EEPROM according to an embodiment of this invention;

FIGS. 2a to 6c are explanatory views showing the manufacturing processes of the embodiment shown in FIG. 1.

DETAILED DESCRIPTION OF THE INVENTION

The art underlying this invention will be first described with reference to FIG. 7, and then an embodiment of this invention will be described with reference to FIGS. 1 to 6.

Figure 7:
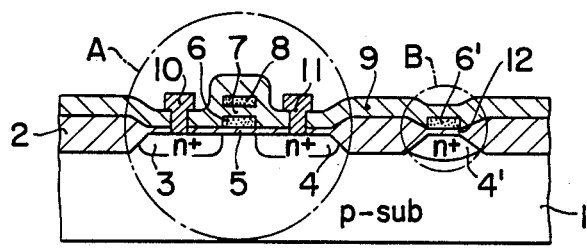
FIG. 7 is a cross sectional view showing a memory cell of a conventional EEPROM; wherein figures labeled (a) in FIGS. 1 to 6 are plan views, figures labeled (b) therein are cross sectional views taken along the A—A line, and figures labeled (c) therein are cross sectional views taken along the B—B line.

As an example of a memory cell of the EEPROM type, there is a memory cell of the structure shown in FIG. 7. Namely, reference numeral 1 denotes a p-type monocrystalline silicon substrate. On the surface of the substrate 1, field oxide films 2 are selectively provided. In an island-shaped substrate 1 region separated by the field oxide films 2, n+ source and drain regions 3 and 4 electrically isolated from each other are provided. In addition, on the substrate 1 region, including the channel region between these regions 3 and 4, a floating gate 6 is provided through a gate oxide film 5. On the floating gate 6, a control gate 8 is provided through an insulating film 7. The entire surface including the control gate 8 is coated with an interlayer insulating film 9. In addition, on the insulating layer 9, source and drain electrodes 10 and 11 connecting to the source and drain regions 3 and 4 through contact holes are provided (portion labeled A in the figure). On the other hand, on the surface of the substrate 1 region adjoining the above-mentioned island-shaped substrate 1 region, an n+ type diffused region 4' serving as an extending portion of the drain region 4 is provided. On the diffused region 4', an extending portion 6' of the floating gate 6 is provided through an insulating thin film 12. Such an n+ type diffused region 4', insulating thin film 12 and extending portion 6' of the floating gate 6 constitute a MOS capacitor designated at B in the figure.

In the memory cell constituted above, when a high voltage, e.g., a voltage more than 20 volts is applied across the drain electrode 11 and the control gate 8, a tunnel current flows in a portion between the extending portion 6' of the floating gate 6 and the n+ type diffused region 4' via the insulating thin film 12. Thus, charge is injected into the floating gate 6 and is drained therefrom. In the EEPROM, it is ordinarily assumed that the state where charge is accumulated in the floating gate represents "0" and the state where no charge is present therein represents "1". These states correspond to the state where the threshold voltage ($V_{TH}$) of the transistor is high and the state where it is low, respectively. Namely, in the EEPROM constituted as stated above, charge is injected into the floating gate 6 through the insulating thin film 12 and the threshold voltage of the transistor of the portion A produced as a result of this injection is detected to thereby read information set in the memory cell therefrom.

Meanwhile, the process for manufacturing the memory cell constituted above is basically the same as the process for preparing an ordinary silicon gate MOS FET in connection with the transistor region of the portion A. Namely, gate oxide film 5 is formed by thermal oxidation on the surface of the island-shaped substrate 1 region separated by the field oxide films 2. Then, an impurity rendering n type conductivity, e.g., As (arsenic) is doped into the substrate 1 surface by ion implantation, etc. with the floating gate 6 comprised of a polycrystalline silicon and the field oxide film 2 as a mask, thus to form n+ type source and drain regions 3 and 4. It is to be noted that the floating gate 6 is formed in an alignment manner with respect to the control gate 8, comprised of the same polycrystalline silicon as that of the floating gate 6, simultaneously with the pattern of the control gate 8.

In the EEPROM memory cell constituted as stated above, however, the manufacturing process is considerably complicated because the MOS capacitor region of the portion B exists. Namely, since the n+ type diffused region 4' at the portion B corresponds to the extending portion of the drain region 4 of the portion A and such a region is required to be formed below the extending portion 6' of the floating gate 6 of the same portion A as that to which the drain region 4 belongs, this region 4' cannot be formed in the same process as that for the drain region 4 formed with the floating gate 6 being a mask as in the above-mentioned process. Accordingly, one is required to form such a region 4' prior to the formation of the floating gate 6 (6'). In addition, the insulating thin film 12 formed between the n+ type diffused region 4' and the extending portion 6' of the floating gate 6 must have a thickness suitable for allowing a tunnel current to flow. Accordingly, the oxide film which has been simultaneously grown prior to the formation of the gate oxide film 5 in the abovementioned transistor region of the portion A cannot be utilized as it is. As a result, one is required to remove the oxide film of that portion after this process to newly cause thermal oxidation to thereby form insulating thin film 12.

Moreover, when information is read from the memory cell constituted above, a suitable readout voltage is applied to the control gate 8 and the drain electrode 11, to discriminate the information written depending upon the magnitude of a current flowing between the source and drain regions 3 and 4 in accordance with the presence or absence of charge existing in the floating gate 6. At this time, the state where no charge exists in the floating gate 6 corresponds to the state where the threshold voltage of the transistor is low. In such a case, a current flows between the source and drain regions 3 and 4 by the application of a readout voltage. However, even when such a relatively low voltage (+5 V) as used for readout in the memory cell of an EEPROM whose channel length is shortened in accordance with miniaturization is applied to the drain 4 and the control gate 8, electrons flowing from the source region 3 toward the drain region 4 are sufficiently accelerated, thus having an energy which can cause impact ionization in the channel region in the vicinity of the drain region 4. Accordingly, in the EEPROM whose channel length is shortened by high integration, when information is being read, electrons are trapped also into the floating gate 6 of the memory cell which should originally have "1" information, eventually resulting in the state equivalent to the state where information "0" of is written. Such a phenomenon is ordinarily called an erroneous writing of information. Where the memory cell constituted as shown in FIG. 7 is integrated to high degree, occurrence of erroneous writing cannot be prevented unless the power supply voltage is lowered. However, lowering the power supply voltage results in the reduction of speed for reading information from the memory cell.

Embodiment

An embodiment in which this invention is applied to a memory cell of an n-channel type EEPROM will be described in detail with reference to FIGS. 1 to 6. In these drawings, FIG. 1 shows the structure of this embodiment, and FIGS. 2 to 6 show respective steps of the manufacturing process therefor wherein figures labeled (a) are plan views of the cell, figures labeled (b) are cross sectional views taken along the A—A line, and figures labeled (c) are cross sectional views taken along the B—B line.

As best shown in FIG. 1, a feature of this embodiment is that a control gate 104 having only one layer is provided, and that a stacking film 108 of three layers, which comprises a silicon oxide thin film 105, a silicon nitride film 106 serving as a charge accumulation layer and a silicon oxide film 107 is formed on the side surface of the control gate 104.

This embodiment will be described by way of the manufacturing processes.

Initially, selective oxidation is applied to a p-type silicon substrate 101, to form a field oxide film 102 for separating the surface of the substrate 101 in the form of an island. Then, thermal oxidation is conducted in an oxidation atmosphere at a temperature of 900° to 1000° C., thus to form an oxide film 103 about 250 Å thick on the island-shaped substrate 101 surface (shown in FIG. 2). Subsequently, an n+ type or p− type impurity doped polycrystalline silicon film 3000 Å thick is stacked the LPCVD method, thereafter to implement patterning to this polycrystalline silicon film to form a control gate 104 of polycrystalline silicon (shown in FIG. 3). Then, thermal oxidation is conducted in an oxidation atmosphere at a temperature of 900° to 1000° C. to grow an oxide film 105, 100 Å thick around the control gate 104 of polycrystalline silicon, thereafter to grow a silicon nitride film 106 on the entire surface thereof by the LPCVD method so that its thickness is about 100 to 1000 Å, to further form a silicon oxide film 107 about 50 Å thick on the surface of the silicon nitride film 106 by hydrogen burning oxidation at a temperature of 950° C. (shown in FIG. 4). Subsequently, an anisotropic etching method, e.g., the reactive ion etching method (RIE method) is used to thereby remove by etching the three-layer stacking film (105, 106, 107) 108 having been previously formed by the film thickness thereof. In this process, the three-layer stacking film 108 is left around the side surface of the control gate (shown in FIG. 5).

Figure 4A:
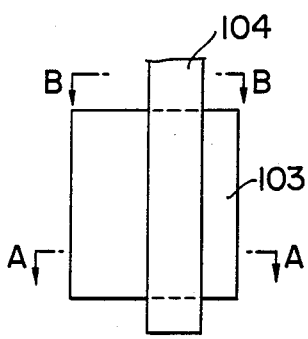
Figure 4B:
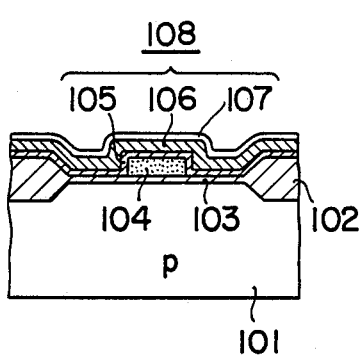
Figure 4C:
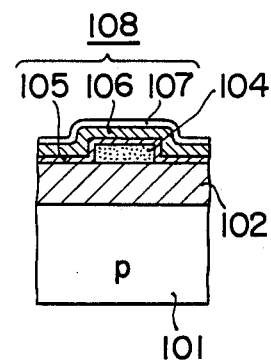
Figure 5A:
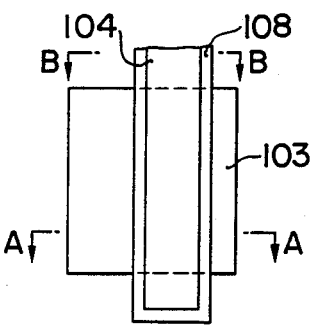
Figure 5B:
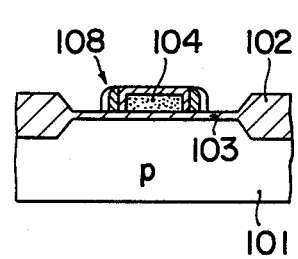
Figure 5C:
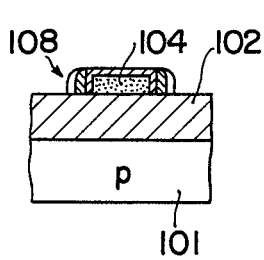
Figure 6A:
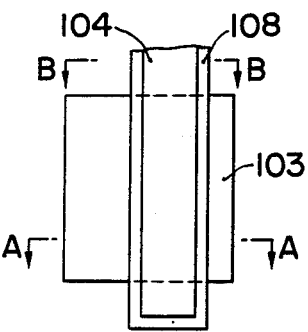
Figure 6B:
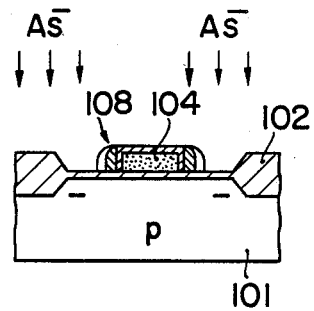
Figure 6C:
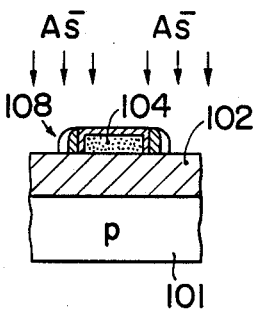

Then, an n-type impurity, e.g., As (arsenic) is subjected to ion implantation under the conditions of a doping energy of 35 KeV and a dosage of $3 \times 10^{15}$ atoms per cm$^2$ with the field oxide film 102, the control gate 104 and the three-layer stacking film 108 being acting as a mask (shown in FIG. 6). Subsequently, As (arsenic) is activated by heat treatment to form N+ type diffused layers 112 and 113 serving as a drain and a source. Further, a SiO$_2$ film 114 is stacked on the entire surface by the CVD method, thereafter to form contact holes 115 and Al electrodes 116 by a well known method, thus to prepare a memory cell of the EEPROM type as shown in FIG. 1.

In such a memory cell, the writing operation is carried out by applying high voltages, e.g., 10 and 8 volts, to the control gate and the drain N+ layer 112 to thereby produce channel thermoelectrons, thus allowing the silicon nitride film 106 in the three-layer film 108 to trap them. Thus, the threshold voltage of about 1 volt before implantation is raised to about 7 volts in about 10 ms. Reading of information is carried out by detecting a difference between threshold voltages of cells. For example, this may be conducted by applying 5 and 3 volts to the control gate 104 and the drain 112, respectively, to detect a difference between current quantities thereof. In addition, erasing of information is carried out by applying a negative voltage, e.g., −6 volts, to the control gate 104 and by applying a positive voltage, e.g., 9 volts, to the drain 112. Namely, information can be selectively erased by making use of the fact that the drain breakdown voltage depends upon a gate voltage and that the drain breakdown voltage is lowered when a negative voltage is applied to the control gate 104. Since erasing can be conducted by the combination of the control gate voltage and the drain voltage, erasing each bit is possible.

As just described above, in accordance with this embodiment, an EEPROM provided with a polysilicon gate of a single layer and the capability of erasing each bit is realized. Further, since this semiconductor device is of one transistor/one cell structure, the size of the cell is drastically reduced as compared to the prior art. In addition, since the gate electrode is of a single layer structure, an EEPROM which can be integrated to a high degree is realized by an extremely simple method as compared to the prior art.

It is to be noted while the control gate 104 is formed of an n-type or p-type impurity doped polysilicon in the above mentioned embodiment, this invention is not limited to such an implementation. For example, the control gate may be formed of silicide of a high melting point metal, e.g., molybdenum, tungsten, titanium or tantalum, etc. Further, while the n-channel type memory cell has been described in the above-mentioned embodiment, this invention is not limited to that implementation. With a p-channel type memory cell, the same advantages as in the above example can be obtained. In addition, while the three-layer stacking film 108 serving as a charge accumulation region is formed by the reactive ion etching method so that it is close to both the drain and source n+ layers 113 and 112 in the above-mentioned embodiment, it is understood that such a film 108 may be provided only on the side of the drain region 113 by using the PEP method.

As described above in detail, in accordance with this invention, since the gate electrode is a single layer structure and a charge accumulation region is formed on the side surface thereof, a semiconductor device of the EEPROM type of the one transistor/one cell structure having a small cell area suitable for high integration and a method capable of extremely simple manufacturing such a semiconductor device is provided.

What is claimed is:

1. A semiconductor device comprising:
   first and second regions separately provided from each other on a surface region of a semiconductor substrate, said first and second regions serving as source and drain regions, respectively,
   a charge accumulation region, and
   a gate provided on a channel region between said first and second regions,
   said charge accumulation region disposed on said channel region on a side surface of said gate and not on a top surface of said gate, said charge accumulation region including a silicon nitride interposed between said gate and said first or second region.

2. A semiconductor device as set forth in claim 1, wherein said charge accumulation region is a silicon nitride having a three-layer stacking film comprising a first silicon oxide film, a silicon nitride film, and a second silicon oxide film all formed on said side surface of said gate.

3. A semiconductor device as set forth in claim 1, wherein said charge accumulation region is located only in the vicinity of said first or second region.

* * * * *